(12) United States Patent
Yoshioka

(10) Patent No.: US 11,024,813 B2
(45) Date of Patent: Jun. 1, 2021

(54) PHOTOELECTRIC CONVERSION ELEMENT, OPTICAL SENSOR, AND IMAGING ELEMENT

(71) Applicant: FUJIFILM Corporation, Tokyo (JP)

(72) Inventor: Tomoaki Yoshioka, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/403,601

(22) Filed: May 5, 2019

(65) Prior Publication Data

US 2019/0259960 A1  Aug. 22, 2019

Related U.S. Application Data

(63) Continuation of application No. PCT/JP2017/039027, filed on Oct. 30, 2017.

(30) Foreign Application Priority Data

Dec. 7, 2016 (JP) .............................. JP2016-237673

(51) Int. Cl.
*H01L 51/00* (2006.01)
*H01L 27/28* (2006.01)
*H01L 27/30* (2006.01)
*H01L 51/44* (2006.01)
*H01L 27/146* (2006.01)
*H01L 51/42* (2006.01)

(52) U.S. Cl.
CPC ........ *H01L 51/0072* (2013.01); *H01L 27/146* (2013.01); *H01L 27/286* (2013.01);
(Continued)

(58) Field of Classification Search
CPC .............. Y02E 10/549; H01L 51/0059; H01L 51/0072; H01L 51/006
See application file for complete search history.

(56) References Cited

U.S. PATENT DOCUMENTS

2010/0212737 A1*  8/2010  Fuhrmann ............. C09B 57/007
                                                                                        136/256
2018/0273760 A1*  9/2018  Rosselli ................. G02B 5/208

FOREIGN PATENT DOCUMENTS

JP    H03188683    8/1991
JP    2002540279   11/2002
(Continued)

OTHER PUBLICATIONS

English machine translation of Hayase et al. (JP 2013-199536 A) provided by the EPO website. (Year: 2020).*
(Continued)

*Primary Examiner* — Daniel P Malley, Jr.
(74) *Attorney, Agent, or Firm* — JCIPRNET

(57) ABSTRACT

A photoelectric conversion element has a conductive film, a photoelectric conversion film, and a transparent conductive film in this order, in which the above-described photoelectric conversion film contains a compound represented by Formula (1).

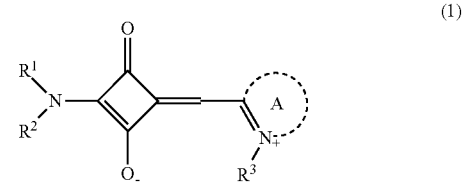

(1)

In Formula (1), $R^1$ and $R^2$ each independently represent an alkyl group, an aryl group, or a heteroaryl group. $R^1$ and $R^2$ may be linked to each other to form a ring. $R^3$ represents an
(Continued)

alkyl group, an aryl group, or a heteroaryl group. A represents a ring at least containing one carbon atom and one cationic nitrogen atom.

13 Claims, 4 Drawing Sheets

(52) U.S. Cl.
CPC .......... *H01L 27/307* (2013.01); *H01L 51/006* (2013.01); *H01L 51/0059* (2013.01); *H01L 51/442* (2013.01); *H01L 51/0074* (2013.01); *H01L 51/4246* (2013.01); *Y02E 10/549* (2013.01)

(56) References Cited

FOREIGN PATENT DOCUMENTS

| JP | 2005319728 | 11/2005 |
| JP | 2010003902 | 1/2010 |
| JP | 2013199536 A | * 10/2013 |
| WO | 0058405 | 10/2000 |
| WO | 2016120166 | 8/2016 |

OTHER PUBLICATIONS

STN structure search conducted by the Examiner, 2021, All Pages (Year: 2021).*

"International Search Report (Form PCT/ISA/210) of PCT/JP2017/039027," dated Jan. 16, 2018, with English translation thereof, pp. 1-5.

"Written Opinion of the International Searching Authority (Form PCT/ISA/237) of PCT/JP2017/039027," dated Jan. 16, 2018, with English translation thereof, pp. 1-7.

Kola Srinivas et al., "Enhanced Diradical Nature in Oxyallyl Derivatives Leads to Near Infra Red Absorption" , J Phys Chem A., vol. 111, Issue 17, May 2007, pp. 3378-3386.

"Office Action of Korea Counterpart Application", dated Jun. 10, 2020, with English translation thereof, p. 1-p. 11.

* cited by examiner

PHOTOELECTRIC CONVERSION ELEMENT, OPTICAL SENSOR, AND IMAGING ELEMENT

CROSS-REFERENCE TO RELATED APPLICATIONS

This application is a Continuation of PCT International Application No. PCT/JP2017/039027, filed on Oct. 30, 2017, which claims priority under 35 U.S.C. § 119(a) to Japanese Patent Application No. 2016-237673, filed on Dec. 7, 2016. Each of the above application(s) is hereby expressly incorporated by reference, in its entirety, into the present application.

BACKGROUND OF THE INVENTION

1. Field of the Invention

The present invention relates to a photoelectric conversion element, an optical sensor, and an imaging element.

2. Description of the Related Art

In the related art, a planar solid-state imaging element in which photodiodes (PD's) are two-dimensionally arranged and a signal charge generated in each PD is read out by a circuit is widely used as a solid-state imaging element.

In order to realize a color solid-state imaging element, a structure in which color filters transmitting light of a specific wavelength are arranged on a light incident surface side of the planar solid-state imaging element is generally used. Currently, a single plate type solid-state imaging element in which color filters transmitting blue (B) light, green (G) light, and red (R) light are regularly arranged on each of the PD's that have been two-dimensionally arranged is well-known. However, in the single plate type solid-state imaging element, light which has not been transmitted through the color filters is not used, and therefore, light utilization efficiency is poor.

In order to solve these disadvantages, in recent years, development of a photoelectric conversion element having a structure in which an organic photoelectric conversion film is disposed on a substrate for reading out a signal has progressed.

For example, a photovoltaic element in which an electron-accepting organic layer is formed using a squarylium compound is disclosed in JP1991-188683A (JP-H03-188683A).

SUMMARY OF THE INVENTION

The present inventor has studied a photoelectric conversion element including a photoelectric conversion film using the squarylium compound specifically disclosed in JP1991-188683A (JP-H03-188683A) as a photoelectric conversion material, and as a result, has found that responsiveness does not necessarily reach a level required at the present time and further improvement is required. In addition, the present inventor has revealed that in a case where a compositional ratio (content of the above-described compound in the photoelectric conversion film) of the above-described compound in the photoelectric conversion film of the above-described photoelectric conversion element varies, a photoelectric conversion efficiency (external quantum efficiency) thereof greatly varies. In particular, it became clear that in a case where a mixing ratio of the above-described compound and a n-type organic semiconductor in the photoelectric conversion film varies, the photoelectric conversion efficiency thereof greatly varies. In a case where the photoelectric conversion efficiency depends on the compositional ratio of the above-described compound of the photoelectric conversion film, it is undesirable from the viewpoint of manufacturing suitability of the photoelectric conversion element.

An object of the present invention is to provide a photoelectric conversion element exhibiting excellent responsiveness and manufacturing suitability.

In addition, another object of the present invention is to provide an optical sensor and an imaging element which comprise the above-described photoelectric conversion element.

The present inventors have conducted extensive studies in order to solve the above-described problems. As a result, they have found that it is possible to solve the above-described problems according to a photoelectric conversion element comprising a photoelectric conversion film containing a compound represented by Formula (1) (preferably a compound represented by Formula (2)) as a photoelectric conversion material, and have completed the present invention.

That is, they have found that it is possible to achieve the above-described object using the following configuration.

(1) A photoelectric conversion element having a conductive film, a photoelectric conversion film, and a transparent conductive film in this order, in which the photoelectric conversion film contains a compound represented by Formula (1) to be described below.

(2) The photoelectric conversion element according to (1), in which a maximum absorption wavelength of the compound represented by Formula (1) is within a range of 500 to 600 nm.

(3) The photoelectric conversion element according to (1) or (2), in which the compound represented by Formula (1) is a compound represented by Formula (2) to be described below.

(4) The photoelectric conversion element according to any one of (1) to (3), in which $R^1$ and $R^2$ are aryl groups.

(5) The photoelectric conversion element according to any one of (1) to (4), in which $R^3$ is an alkyl group having 1 to 3 carbon atoms.

(6) The photoelectric conversion element according to (3), in which $R^4$ to $R^7$ are hydrogen atoms.

(7) The photoelectric conversion element according to any one of (1) to (6), in which the above-described photoelectric conversion film further contains an n-type organic semiconductor.

(8) The photoelectric conversion element according to any one of (1) to (7), further comprising: an electric charge blocking film.

(9) An optical sensor comprising: the photoelectric conversion element according to any one of (1) to (8).

(10) An imaging element comprising: the photoelectric conversion element according to any one of (1) to (8).

According to the present invention, it is possible to provide a photoelectric conversion element exhibiting excellent responsiveness and manufacturing suitability. In addition, according to the present invention, it is possible to provide an optical sensor and an imaging element which comprise the above-described photoelectric conversion element.

DESCRIPTION OF THE PREFERRED EMBODIMENTS

[Photoelectric Conversion Element]

Hereinafter, suitable embodiments of a photoelectric conversion element of the present invention will be described.

In the present specification, a substituent (preferably a substituent W to be described below) may be further substituted with a substituent or the like within the scope not impairing an intended effect for which whether it is substituted or unsubstituted is not specified. For example, the expression "alkyl group" corresponds to an alkyl group with which a substituent (preferably a substituent W) may be substituted.

In addition, in the present specification, the numerical range represented by "to" means a range including numerical values denoted before and after "to" as a lower limit value and an upper limit value.

An example of a characteristic point of the present invention compared with the technique in the related art includes a point that a squarylium compound having a predetermined structure (hereinafter, also simply referred to as a "specific squarylium compound") is used. A specific organic group is introduced into this specific squarylium compound at a specific position, and as a result, the characteristics (responsiveness and manufacturing suitability) of a photoelectric conversion element having a photoelectric conversion film containing this specific squarylium compound are improved.

Hereinafter, suitable embodiments of the photoelectric conversion element of the present invention will be described with reference to the drawings. A schematic cross-sectional view of an embodiment of a photoelectric conversion element of the present invention is shown in FIG. 1.

A photoelectric conversion element 10a shown in FIG. 1A has a configuration in which a conductive film (hereinafter, also referred to as a lower electrode) 11 functioning as the lower electrode, an electron blocking film 16A, a photoelectric conversion film 12 containing a compound represented by Formula (1) to be described below, and a transparent conductive film (hereinafter, also referred to as an upper electrode) 15 functioning as the upper electrode are laminated in this order.

Figure 1A:
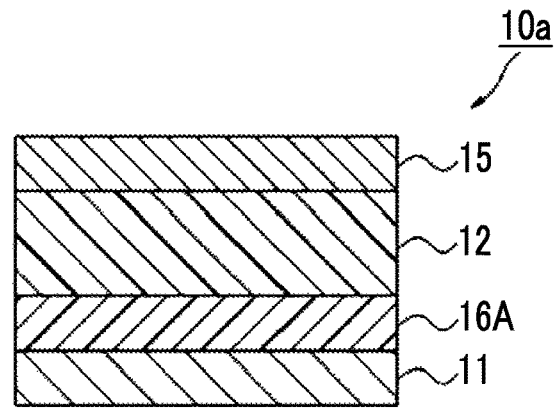
FIG. 1A is a schematic cross-sectional view showing a configuration example of a photoelectric conversion element.
Figure 1B:
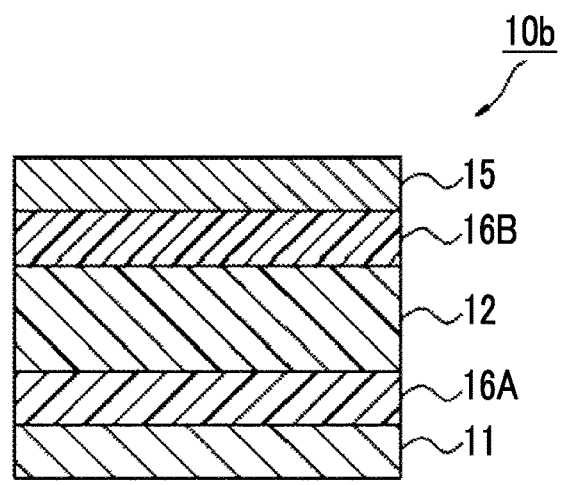
FIG. 1B is a schematic cross-sectional view showing a configuration example of a photoelectric conversion element.

A configuration example of another photoelectric conversion element is shown in FIG. 1B. A photoelectric conversion element 10b shown in FIG. 1B has a configuration in which an electron blocking film 16A, a photoelectric conversion film 12, a hole blocking film 16B, and an upper electrode 15 are laminated on a lower electrode 11 in this order. The lamination order of the electron blocking film 16A, the photoelectric conversion film 12, and the hole blocking film 16B in FIGS. 1A and 1B may be appropriately changed in accordance with the application and characteristics.

In the configuration of the photoelectric conversion element 10a (or 10b), light is preferably incident on the photoelectric conversion film 12 through the upper electrode 15. In addition, in a case of using the photoelectric conversion element 10a (or 10b), a voltage can be applied. In this case, it is preferable that the lower electrode 11 and the upper electrode 15 form a pair of electrodes and a voltage of $1 \times 10^5$ to $1 \times 10^7$ V/cm is applied between this pair of electrodes. From the viewpoints of performance and power consumption, a voltage of $1 \times 10^4$ to $1 \times 10^7$ V/cm is more preferable and a voltage of $1 \times 10^{-3}$ to $5 \times 10^6$ V/cm is still more preferable.

As the voltage application method, application of a voltage is preferably performed such that the electron blocking film 16A side in FIGS. 1A and 1B becomes a cathode and the photoelectric conversion film 12 side becomes an anode. It is possible to apply a voltage through the same method in cases where the photoelectric conversion element 10a (or 10b) is used as an optical sensor or is incorporated into an imaging element.

As will be described in detail below, the photoelectric conversion element 10a (or 10b) can be suitably applied to applications of the imaging element and the optical sensor.

Figure 2:
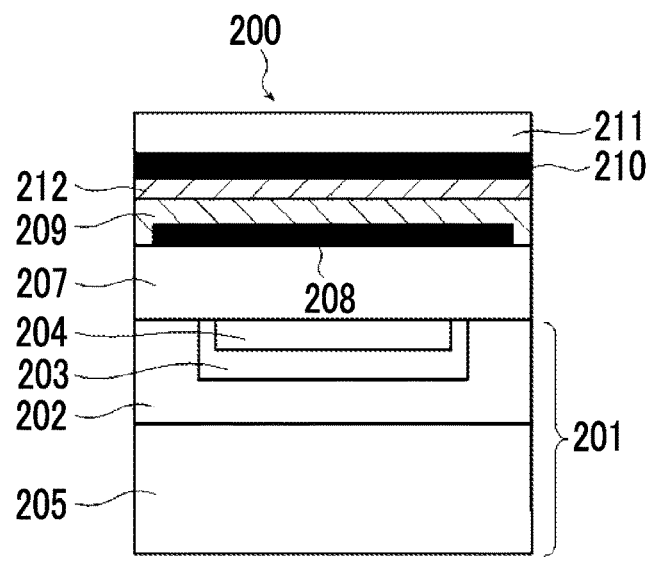
FIG. 2 is a schematic cross-sectional view of one pixel of a hybrid type photoelectric conversion element.

In addition, a schematic cross-sectional view of another embodiment of a photoelectric conversion element of the present invention is shown in FIG. 2.

A photoelectric conversion element 200 shown in FIG. 2 is a hybrid type photoelectric conversion element including an organic photoelectric conversion film 209 and an inorganic photoelectric conversion film 201. The organic photoelectric conversion film 209 includes a compound represented by Formula (1) to be described below.

The inorganic photoelectric conversion film 201 has an n-type well 202, a p-type well 203, and an n-type well 204 on a p-type silicon substrate 205.

Blue light is photoelectrically converted (B pixel) at a p-n junction formed between the p-type well 203 and the n-type well 204 and red light is photoelectrically converted (R pixel) at a p-n junction formed between the p-type well 203 and the n-type well 202. The conduction types of the n-type well 202, the p-type well 203, and the n-type well 204 are not limited thereto.

Furthermore, a transparent insulating layer 207 is disposed on the inorganic photoelectric conversion film 201.

A transparent pixel electrode 208 divided for each pixel is disposed on the insulating layer 207. An organic photoelectric conversion film 209 which absorbs green light and performs photoelectric conversion is disposed on the transparent pixel electrode in a single layer configuration commonly for each pixel. An electron blocking film 212 is disposed on the organic photoelectric conversion film in a single layer configuration commonly for each pixel. A transparent common electrode 210 with a single layer configuration is disposed on the electron blocking film. A transparent protective film 211 is disposed on the uppermost layer. The lamination order of the electron blocking film 212 and the organic photoelectric conversion film 209 may be reversed from that in FIG. 2, and the common electrode 210 may be disposed so as to be divided for each pixel.

The organic photoelectric conversion film 209 constitutes a G pixel for detecting green light.

The pixel electrode 208 is the same as the lower electrode 11 of the photoelectric conversion element 10a shown in FIG. 1A. The common electrode 210 is the same as the upper electrode 15 of the photoelectric conversion element 10a shown in FIG. 1A.

In a case where light from a subject is incident on the photoelectric conversion element 200, green light in the incident light is absorbed by the organic photoelectric conversion film 209 to generate optical charges. The optical charges flow into and accumulate in a green signal charge accumulation region not shown in the drawing from the pixel electrode 208.

The mixed light of the blue light and the red light transmitted through the organic photoelectric conversion film 209 enters the inorganic photoelectric conversion film 201. The blue light having a short wavelength is photoelectrically converted mainly at a shallow portion (in the vicinity of a p-n junction formed between the p-type well 203 and the n-type well 204) of a semiconductor substrate (inorganic photoelectric conversion film) 201 to generate optical charges, and a signal is output to the outside. The red light having a long wavelength is photoelectrically converted mainly at a deep portion (in the vicinity of a p-n junction formed between the p-type well 203 and the n-type well 202) of the semiconductor substrate (inorganic photoelectric conversion film) 201 to generate optical charges, and a signal is output to the outside.

In a case where the photoelectric conversion element 200 is used in an imaging element, a signal readout circuit (an electric charge transfer path in a case of a charge coupled device (CCD) type or a metal-oxide-semiconductor (MOS) transistor circuit in a case of a complementary metal oxide semiconductor (CMOS) type) or a green signal charge accumulation region is formed in a surface portion of the p-type silicon substrate 205. In addition, the pixel electrode 208 is connected to the corresponding green signal charge accumulation region through vertical wiring.

Hereinafter, the form of each layer constituting the photoelectric conversion element of the present invention will be described in detail.

[Photoelectric Conversion Film]

(Compound Represented by Formula (1))

The photoelectric conversion film 12 (or the organic photoelectric conversion film 209) is a film containing a compound represented by Formula (1) as a photoelectric conversion material. A photoelectric conversion element exhibiting excellent responsiveness and manufacturing suitability can be obtained using this compound.

Hereinafter, the compound represented by Formula (1) will be described in detail.

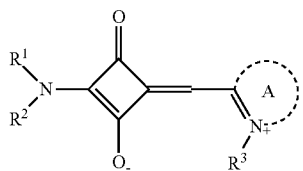

(1)

In Formula (1), $R^1$ and $R^2$ each independently represent an alkyl group, an aryl group, or a heteroaryl group. Among these, $R^1$ and $R^2$ are preferably aryl groups from the viewpoint of obtaining superior responsiveness and/or manufacturing suitability of a photoelectric conversion element (hereinafter, also simply referred to as "viewpoint of obtaining a superior effect of the present invention").

$R^1$ and $R^2$ may be linked to each other to form a ring. The type of ring to be formed is not particularly limited. It may be an aromatic ring or a non-aromatic ring, and it is preferably an aromatic ring. In addition, the ring may be a monocyclic ring or a condensed ring consisting of two or more rings. In addition, the aromatic ring may be an aromatic hydrocarbon ring or an aromatic heterocyclic ring. A substituent (preferably a substituent W to be described below) may be substituted with the ring formed by linking $R^1$ and $R^2$ to each other.

It is more preferable that $R^1$ and $R^2$ are aryl groups and are not linked to each other to form a ring from the viewpoint of obtaining a superior effect of the present invention.

The number of carbon atoms in an alkyl group represented by $R^1$ and $R^2$ is not particularly limited, but is preferably 1 to 10, more preferably 1 to 6, and still more preferably 1 to 3 from the viewpoint of obtaining a superior effect of the present invention. The alkyl group may be linear, branched, or cyclic. In addition, a substituent (preferably a substituent W (other than an alkyl group) to be described below) may be substituted with the alkyl group.

Examples of the above-described alkyl group include a methyl group, an ethyl group, an n-propyl group, an i-propyl group, an n-butyl group, an n-hexyl group, and a cyclohexyl group.

The number of carbon atoms in an aryl group represented by $R^1$ and $R^2$ is not particularly limited, but is preferably 6 to 30 and more preferably 6 to 18 from the viewpoint of obtaining a superior effect of the present invention. The aryl group may have a monocyclic structure or a condensed ring structure in which two or more rings are condensed. In addition, a substituent (preferably a substituent W to be described below) may be substituted with the aryl group.

Examples of the above-described aryl group include a phenyl group, a naphthyl group, an anthryl group, a pyrenyl group, a phenanthrenyl group, a methylphenyl group, a dimethylphenyl group, a biphenyl group, and a fluorenyl group, and a phenyl group, a naphthyl group, an anthryl group is preferable, and a phenyl group is more preferable.

The number of carbon atoms in a heteroaryl group (monovalent aromatic heterocyclic group) represented by $R^1$ and $R^2$ is not particularly limited, but is preferably 3 to 30 and more preferably 3 to 18 from the viewpoint of obtaining a superior effect of the present invention. In addition, a substituent (preferably a substituent W to be described below) may be substituted with the heteroaryl group.

A hetero atom is included in the heteroaryl group in addition to a carbon atom and a hydrogen atom. Examples of the hetero atom include a nitrogen atom, a sulfur atom, an oxygen atom, a selenium atom, a tellurium atom, a phosphorus atom, a silicon atom, and a boron atom. A nitrogen atom, a sulfur atom, or an oxygen atom is preferable.

The number of hetero atoms contained in a heteroaryl group is not particularly limited, but is usually about 1 to 10, preferably 1 to 4, and more preferably 1 or 2.

The number of ring members of a heteroaryl group is not particularly limited, but is preferably a 3- to 8-membered ring, more preferably a 5- to 7-membered ring, and still more preferably a 5- to 6-membered ring. The heteroaryl group may have a monocyclic structure or a condensed ring structure in which two or more rings are condensed. In the case of the condensed ring structure, an aromatic hydrocarbon ring (for example, a benzene ring) which does not contain a hetero atom may be contained therein.

Examples of the above-described heteroaryl group include a pyridyl group, a quinolyl group, an isoquinolyl group, an acridinyl group, a phenanthridinyl group, a pteridinyl group, a pyrazinyl group, a quinoxalinyl group, a pyrimidinyl group, a quinazolinyl group, a pyridazinyl group, a cinnolinyl group, a phthalazinyl group, a triazinyl group, an oxazolyl group, a benzoxazolyl group, a thiazolyl group, a benzothiazolyl group, an imidazolyl group, a benzimidazolyl group, a pyrazolyl group, an indazolyl group, an isoxazolyl group, a benzisoxazolyl group, an isothiazolyl group, a benzisothiazolyl group, an oxadiazolyl group, a thiadiazolyl group, a triazolyl group, a tetrazolyl group, a furyl group, a benzofuryl group, a thienyl group, a benzothienyl group, a dibenzofuryl group, a dibenzothienyl group, a pyrrolyl group, an indolyl group, an imidazopyridinyl group, and a carbazolyl group.

$R^3$ represents an alkyl group, an aryl group, or a heteroaryl group. Examples of an alkyl group, an aryl group, or a heteroaryl group represented by $R^3$ include those exemplified for $R^1$ and $R^2$, and suitable aspects thereof are also the same. Among these, $R^3$ is preferably an alkyl group and more preferably an alkyl group having 1 to 3 carbon atoms from the viewpoint of obtaining a superior effect of the present invention.

A represents a ring at least containing one carbon atom and one cationic nitrogen atom. The above-described one carbon atom and one cationic nitrogen atom are intended to be a carbon atom and a cationic nitrogen atom contained in a group represented by C=N$^+$ in Formula (1). The type of ring is not particularly limited. It may be an aromatic ring or a non-aromatic ring, and it is preferably an aromatic ring. In addition, the ring may be a monocyclic ring or a condensed ring consisting of two or more rings. In addition, the aromatic ring may be an aromatic hydrocarbon ring or an aromatic heterocyclic ring. In addition, a substituent (preferably a substituent W to be described below) may be substituted with the above-described ring.

(Compound Represented by Formula (2))

Among the compounds represented by Formula (1), a compound represented by Formula (2) is more preferable.

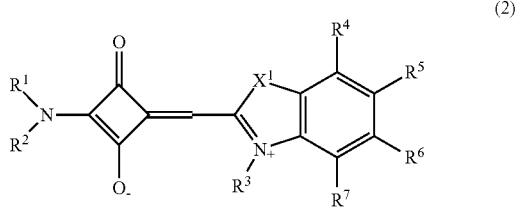

(2)

In Formula (2), $R^1$ and $R^2$ each independently represent an aryl group or a heteroaryl group. In particular, $R^1$ and $R^2$ are preferably aryl groups from the viewpoint of obtaining a superior effect of the present invention.

$R^1$ and $R^2$ may be linked to each other to form a ring. The type of ring to be formed is not particularly limited. It may be an aromatic ring or a non-aromatic ring, and it is preferably an aromatic ring. In addition, the ring may be a monocyclic ring or a condensed ring consisting of two or more rings. In addition, the aromatic ring may be an aromatic hydrocarbon ring or an aromatic heterocyclic ring. A substituent (preferably a substituent W to be described below) may be substituted with the ring formed by linking $R^1$ and $R^2$ to each other.

It is preferable that $R^1$ and $R^2$ are aryl groups and are not linked to each other to form a ring from the viewpoint of obtaining a superior effect of the present invention.

The definitions of the aryl group represented by $R^1$ and $R^2$ and the heteroaryl group represented by $R^1$ and $R^2$, and suitable aspects thereof are respectively the same as those shown in Formula (1).

The definition of $R^3$ in Formula (2) is the same as the definition of $R^3$ in Formula (1), and the suitable aspects thereof is also the same.

in Formula (2), $R^4$ to $R^7$ each independently represent a hydrogen atom or a substituent. The definition of the above-described substituent is synonymous with the substituent W to be described below.

Adjacent groups among $R^4$ to $R^7$ ($R^4$ and $R^5$, $R^5$ and $R^6$, or $R^6$ and $R^7$) may be linked to each other to form a ring. The type of ring to be formed is not particularly limited. It may be an aromatic ring or a non-aromatic ring, and it is preferably an aromatic ring. In addition, the ring may be a monocyclic ring or a condensed ring consisting of two or more rings. In addition, the aromatic ring may be an aromatic hydrocarbon ring or an aromatic heterocyclic ring. A substituent (preferably a substituent W to be described below) may be substituted with the ring formed by linking adjacent groups among $R^4$ and $R^7$ to each other.

In particular, $R^4$ to $R^7$ are preferably hydrogen atoms from the viewpoint of obtaining a superior effect of the present invention.

$X^1$ represents any one selected from a sulfur atom, an oxygen atom, a selenium atom, $CR^{41}R^{42}$, $CR^{43}$=$CR^{44}$, and $NR^{45}$. Among these, $X^1$ preferably represents any one selected from a sulfur atom, a selenium atom, $CR^{41}R^{42}$, or $CR^{43}$=$CR^{44}$ from the viewpoint of obtaining a superior effect of the present invention.

$R^{41}$ to $R^{45}$ each independently represent a hydrogen atom, an alkyl group, an aryl group, or a heteroaryl group. Examples of an alkyl group, an aryl group, or a heteroaryl group represented by $R^{41}$ to $R^{45}$ include those exemplified for $R^1$ and $R^2$, and suitable aspects thereof are also the same. Among these, $R^{41}$ and $R^{42}$ each independently represents preferably a hydrogen atom or an alkyl group and more preferably an alkyl group having 1 to 3 carbon atoms from the viewpoint of obtaining a superior effect of the present invention. In addition, $R^{43}$ and $R^{44}$ each independently represents preferably a hydrogen atom or an alkyl group, more preferably an alkyl group having 1 to 3 carbon atoms or a hydrogen atom, and still more preferably a hydrogen atom from the viewpoint of obtaining a superior effect of the present invention.

Hereinafter, the compound represented by Formula (1) and the compound represented by Formula (2) will be exemplified.

In the following tables, "Ph" represents a phenyl group, "Me" represents a methyl group, "Et" represents an ethyl group, "Pr" represents a propyl group, and "Bu" represents a butyl group. In addition, in the column X in the tables, "—C(CH3)2—" means "—C(CH$_3$)$_2$—" and "—CH2=CH2-" means "—CH$_2$=CH$_2$—".

[Table 1]

TABLE 1

(2)

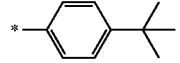

| | $R^1$ | $R^2$ | $X^1$ | $R^3$ | $R^4$ | $R^5$ | $R^6$ | $R^7$ |
|---|---|---|---|---|---|---|---|---|
| 1 | Ph | Ph | —C(CH3)2— | Me | H | H | H | H |
| 2 | Ph | Ph | —C(CH3)2— | Et | H | H | H | H |
| 3 | Ph | Ph | —C(CH3)2— | i-Pr | H | H | H | H |
| 4 | Ph | Ph | —C(CH3)2— | n-Bu | H | H | H | H |
| 5 | Ph | Ph | —C(CH3)2— | t-Bu | H | H | H | H |
| 6 | Ph | Ph | —C(CH3)2— | Ph | H | H | H | H |
| 7 | Ph | Ph | —C(CH3)2— | (4-tert-butylphenyl) | H | H | H | H |

TABLE 1-continued (2)

| | R¹ | R² | X¹ | R³ | R⁴ | R⁵ | R⁶ | R⁷ |
|---|---|---|---|---|---|---|---|---|
| 8 | Ph | Ph | —C(CH3)2— | 2-methoxyphenyl | H | H | H | H |
| 9 | Ph | Ph | —C(CH3)2— | n-hexyl | H | H | H | H |
| 10 | Ph | Ph | —C(CH3)2— | benzyl | H | H | H | H |
| 11 | Ph | Ph | —C(CH3)2— | 2-furyl | H | H | H | H |
| 12 | Ph | Ph | —C(CH3)2— | 2-benzothienyl | H | H | H | H |
| 13 | Ph | Ph | —C(CH3)2— | Me | H | Me | Me | H |
| 14 | Ph | Ph | —C(CH3)2— | Me | Me | H | H | Me |
| 15 | Ph | Ph | —C(CH3)2— | Me | H | Ph | H | H |

TABLE 2

(2)

| | R¹ | R² | X¹ | R³ | R⁴ | R⁵ | R⁶ | R⁷ |
|---|---|---|---|---|---|---|---|---|
| 16 | Ph | Ph | —C(CH3)2— | Me | H | OMe | OMe | H |
| 17 | Ph | Ph | —C(CH3)2— | Me | H | Cl | Cl | H |
| 18 | Ph | Ph | —C(CH3)2— | Me | F | F | F | F |
| 19 | Ph | Ph | S | Me | H | H | H | H |
| 20 | Ph | Ph | S | Et | H | H | H | H |
| 21 | Ph | Ph | S | n-Pr | H | H | H | H |
| 22 | Ph | Ph | S | p-tolyl | H | H | H | H |
| 23 | Ph | Ph | S | 2-thiophenyl | H | H | H | H |
| 24 | Ph | Ph | Se | Me | H | H | H | H |
| 25 | Ph | Ph | Se | Et | H | H | H | H |
| 26 | Ph | Ph | Se | i-Bu | H | H | H | H |
| 27 | Ph | Ph | Se | 2-naphthyl | H | H | H | H |
| 28 | Ph | Ph | —CH2=CH2— | Me | H | H | H | H |
| 29 | Ph | Ph | —CH2=CH2— | Et | H | H | H | H |
| 30 | Ph | Ph | —CH2=CH2— | 2-ethylhexyl | H | H | H | H |
| 31 | Ph | Ph | —CH2=CH2— | 1-naphthyl | H | H | H | H |
| 32 | Ph | Ph | —CH2=CH2— | 3-pyridyl | H | H | H | H |
| 33 | Ph | Ph | —NMe— | Me | H | H | H | H |
| 34 | Ph | Ph | —NMe— | Et | H | H | H | H |
| 35 | Ph | Ph | —NMe— | Ph | H | H | H | H |
| 36 | Ph | Ph | —NPh— | Ph | H | H | H | H |

TABLE 3

(2)

| | R¹ | R² | X¹ | R³ | R⁴ | R⁵ | R⁶ | R⁷ |
|---|---|---|---|---|---|---|---|---|
| 37 | Ph | 1-naphthyl | —C(CH3)2— | Me | H | H | H | H |
| 38 | 2-naphthyl | 1-naphthyl | —C(CH3)2— | Me | H | H | H | H |
| 39 | Ph | 2-naphthyl | —C(CH3)2— | Me | H | H | H | H |
| 40 | 2-naphthyl | 2-naphthyl | —C(CH3)2— | Me | H | H | H | H |
| 41 | 1-naphthyl | 1-naphthyl | —C(CH3)2— | Me | H | H | H | H |
| 42 | 4-methoxyphenyl | 4-methoxyphenyl | —C(CH3)2— | Me | H | H | H | H |
| 43 | 4-tert-butylphenyl | 4-tert-butylphenyl | —C(CH3)2— | Me | H | H | H | H |

TABLE 3-continued (2)

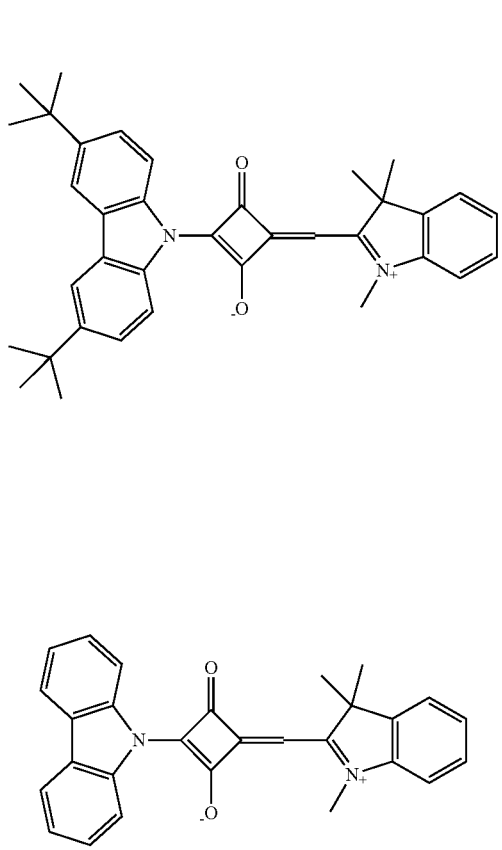

| | R¹ | R² | X¹ | R³ | R⁴ | R⁵ | R⁶ | R⁷ |
|---|---|---|---|---|---|---|---|---|
| 44 | 2-methylphenyl | 2-methylphenyl | —C(CH3)2— | Me | H | H | H | H |
| 45 | 3-pyridyl | 3-pyridyl | —C(CH3)2— | Me | H | H | H | H |
| 46 | Ph | 2-thienyl | —C(CH3)2— | Me | H | H | H | H |
| 47 | Me | Me | —C(CH3)2— | Me | H | H | H | H |
| 48 | Et | Et | —C(CH3)2— | Me | H | H | H | H |
| 49 | n-Bu | n-Bu | —C(CH3)2— | Me | H | H | H | H |
| 50 | 2-ethylhexyl | 2-ethylhexyl | —C(CH3)2— | Me | H | H | H | H |
| 51 | Me | Ph | —C(CH3)2— | Me | H | H | H | H |
| 52 | Me | 1-naphthyl | —C(CH3)2— | Me | H | H | H | H |

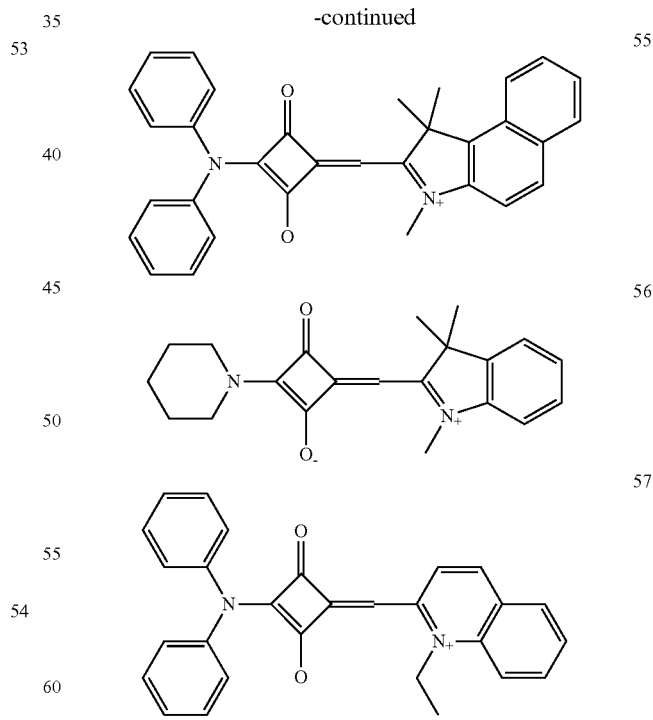

The substituent W in the present specification will be described below.

Examples of the substituent W include a halogen atom, an alkyl group (including a cycloalkyl group, a bicycloalkyl group, and a tricycloalkyl group), an alkenyl group (including a cycloalkenyl group and a bicycloalkenyl group), an alkynyl group, an aryl group, a heterocyclic group, a cyano group, a hydroxy group, a nitro group, a carboxy group, an alkoxy group, an aryloxy group, a silyloxy group, a heterocyclic oxy group, an acyloxy group, a carbanoyloxy group, an alkoxycarbonyloxy group, an aryloxycarbonyloxy group, an amino group (including an anilino group), an ammonium group, an acylamino group, an aminocarbonylamino group, an alkoxycarbonylamino group, an aryloxycarbonylamino group, a sulfamoylamino group, an alkyl- or arylsulfonylamino group, a mercapto group, an alkylthio group, an arylthio group, a heterocyclic thio group, a sulfamoyl group, a sulfo group, an alkyl- or arylsulfinyl group, an alkyl- or arylsulfonyl group, an acyl group, an aryloxycarbonyl group, an alkoxycarbonyl group, a carbamoyl group, an aryl- or heterocyclic azo group, an imide group, a phosphino group, a phosphinyl group, a phosphinyloxy group, a phosphinylamino group, a phosphono group, a silyl group, a hydrazino group, a ureido group, a boronic acid group (—B(OH)$_2$), a phosphato group (—OPO(OH)$_2$), a sulfato group (—OSO$_3$H), and other well-known substituents.

In addition, the substituent W may be further substituted with a substituent W. For example, an alkyl group may be substituted with a halogen atom.

The details of the substituent W are disclosed in paragraph [0023] of JP2007-234651A.

The molecular weight of the compound represented by Formula (1) is not particularly limited, but is preferably 300 to 900. In a case where the molecular weight is less than or equal to 900, the vapor deposition temperature does not increase, and therefore, decomposition of the compound hardly occurs. In a case where the molecular weight is greater than or equal to 300, the glass transition point of a vapor deposition film does not decrease, and therefore, the heat resistance of the photoelectric conversion element is improved.

The compound represented by Formula (1) is preferably a compound in which an ionization potential in a single film is −5.0 to −6.0 eV from the viewpoints of stability in a case of using the compound as a p-type organic semiconductor and matching of energy levels between the compound and an n-type organic semiconductor.

The maximum absorption wavelength of the compound represented by Formula (1) is preferably within a range of 450 to 650 nm and more preferably within a range of 500 to 600 nm in order to be applicable to the above-described organic photoelectric conversion film 209 which absorbs green light and performs photoelectric conversion. The above-described maximum absorption wavelength is a value measured in a solution state (solvent:chloroform) by adjusting an absorption spectrum of the compound represented by Formula (1) to a concentration to such a degree that the absorbance becomes 0.5 to 1.

The compound represented by Formula (1) is particularly useful as a material for a photoelectric conversion film used for an imaging element, an optical sensor, or a photoelectric cell. In many cases, the compound represented by Formula (1) usually functions as a p-type organic compound (p-type organic semiconductor) within the photoelectric conversion film. In addition, the compound represented by Formula (1) can also be used as a coloring material, a liquid crystal material, an organic semiconductor material, a charge transport material, a pharmaceutical material, and a fluorescent diagnostic drug material.

(Other Materials)

The photoelectric conversion film may contain components other than the above-described compound represented by Formula (1). For example, the photoelectric conversion film may contain an n-type organic semiconductor.

The n-type organic semiconductor is an acceptor organic semiconductor material (compound) and refers to an organic compound having a property of easily accepting electrons. More specifically, the n-type organic semiconductor refers to an organic compound having a higher electron affinity in a case where two organic compounds are brought into contact with each other.

Examples of the n-type organic semiconductor include a condensed aromatic carbocyclic compound (for example, a naphthalene derivative, an anthracene derivative, a phenanthrene derivative, a tetracene derivative, a pyrene derivative, a perylene derivative, and a fluoranthene derivative), 5- to 7-membered heterocyclic compounds (for example, pyridine, pyrazine, pyrimidine, pyridazine, triazine, quinoline, quinoxaline, quinazoline, phthalazine, cinnoline, isoquinoline, pteridine, acridine, phenazine, phenanthroline, tetrazole, pyrazole, imidazole, and thiazole) which contain at least one of a nitrogen atom, an oxygen atom, or a sulfur atom, a polyarylene compound, a fluorene compound, a cyclopentadiene compound, a silyl compound, and a metal complex having a nitrogen-containing heterocyclic compound as a ligand.

An organic coloring agent may be used as the n-type organic semiconductor. Examples thereof include a cyanine coloring agent, a styryl coloring agent, a hemicyanine coloring agent, a merocyanine coloring agent (containing zero methine merocyanine (simple merocyanine)), a rhodacyanine coloring agent, an allopolar coloring agent, an oxonol coloring agent, a hemioxonol coloring agent, a croconium coloring agent, an azamethine coloring agent, a coumarin coloring agent, an arylidene coloring agent, an anthraquinone coloring agent, a triphenylmethane coloring agent, an azo coloring agent, an azomethine coloring agent, a metallocene coloring agent, a fluorenone coloring agent, a fulgide coloring agent, a perylene coloring agent, a phenazine coloring agent, a phenothiazine coloring agent, a quinone coloring agent, a diphenylmethane coloring agent, a polyene coloring agent, an acridine coloring agent, an acridinone coloring agent, a diphenylamine coloring agent, a quinophthalone coloring agent, a phenoxazine coloring agent, a phthaloperylene coloring agent, a dioxane coloring agent, a porphyrin coloring agent, a chlorophyll coloring agent, a phthalocyanine coloring agent, and a metal complex coloring agent.

On the other hand, in the case of the form shown in FIG. 2, it is desirable that the n-type organic semiconductor is colorless or has a maximum absorption wavelength and/or an absorption waveform close to the compound represented by Formula (1), and it is desirable that the specific numerical value of the maximum absorption wavelength is less than or equal to 400 nm or 500 nm to 600 nm.

The photoelectric conversion film preferably has a bulk hetero structure which is formed in a state in which the above-described compound represented by Formula (1) is mixed with the n-type organic semiconductor. The bulk hetero structure is a layer in which an n-type organic semiconductor and a p-type organic semiconductor are mixed with each other and dispersed in a photoelectric conversion film. A photoelectric conversion film having the bulk hetero structure can be formed through either a wet method or a dry method. The bulk hetero structure is described in detail in <0013> to <0014> of JP-2005-303266A.

The content of the compound represented by Formula (1) to the total content of the compound represented by Formula (1) and the n-type organic semiconductor (=film thickness in terms of single layer of compound represented by Formula (1)/(film thickness in terms of single layer of compound represented by Formula (1)+ film thickness in terms of single layer of n-type organic semiconductor)×100) is preferably 20 to 80 volume %, more preferably 30 to 70 volume %, and still more preferably 35 to 65 volume % from the viewpoint of responsiveness of the photoelectric conversion element.

The photoelectric conversion film containing the compound represented by Formula (1) is non-luminescent film and has characteristics different from those of an organic electric field light emitting element (OLED). The non-luminescent film means a film having a luminescence quantum efficiency of less than or equal to 1%. The luminescence quantum efficiency is preferably less than or equal to 0.5% and more preferably less than or equal to 0.1%.

(Film Forming Method)

The photoelectric conversion film can be formed mainly through a dry film formation method. Specific examples of the dry film formation method include physical vapor phase growth methods such as a vapor deposition method (particularly a vacuum vapor deposition method), a sputtering method, an ion plating method, and a molecular beam epitaxy (MBE) method, or chemical vapor deposition (CVD) methods such as plasma polymerization. Among these, the vacuum vapor deposition method is preferable. In a case where a photoelectric conversion film is formed through the vacuum vapor deposition method, it is possible to set the manufacturing conditions such as the vacuum degree and the vapor deposition temperature in accordance with a usual method.

The thickness of a photoelectric conversion film is preferably 10 to 1,000 nm, more preferably 50 to 800 nm, and still more preferably 50 to 500 nm.

[Electrode]

The electrodes (the upper electrode (transparent conductive film) 15 and the lower electrode (conductive film) 11) are made of a conductive material. Examples of the conductive material include metal, alloy, a metal oxide, an electrically conductive compound, and a mixture thereof.

Since light is incident from the upper electrode 15, it is preferable that the upper electrode 15 is transparent for light to be detected. Examples of the material forming the upper electrode 15 include conductive metal oxides such as tin oxide (ATO, FTO) doped with antimony, fluorine, or the like, tin oxide, zinc oxide, indium oxide, indium tin oxide (ITO), and indium zinc oxide (IZO), metal thin films such as gold, silver, chromium, and nickel, mixtures or laminates of these metals and the conductive metal oxides, and organic conductive materials such as polyaniline, polythiophene, and polypyrrole. Among these, conductive metal oxides are preferable from the viewpoints of high conductivity, transparency, and the like.

In general, in a case where a conductive film is made to be thinner than a certain range, a resistance value is rapidly increased. In the solid-state imaging element into which the photoelectric conversion element according to the present embodiment is incorporated, the sheet resistance is preferably 100 to 10,000Ω/□, and the degree of freedom of the range of the film thickness that can be thinned is large. In addition, as the thickness of the upper electrode (transparent conductive film) 15 is thinner, the amount of light absorbed becomes smaller and the light transmittance usually becomes larger. The increase in the light transmittance increases light absorbance in the photoelectric conversion film and increases the photoelectric conversion ability, which is preferable. Considering suppression of leakage current, an increase in a resistance value of a thin film, and an increase in transmittance accompanied by the thinning, the film thickness of the upper electrode 15 is preferably 5 to 100 nm and more preferably 5 to 20 nm.

There is a case where the lower electrode 11 has a transparency depending on the application or an opposite case where the lower electrode does not have transparency and reflects light. Examples of a material constituting the lower electrode 11 include conductive metal oxides such as tin oxide (ATO, FTO) doped with antimony, fluorine, or the like, tin oxide, zinc oxide, indium oxide, indium tin oxide (ITO), and indium zinc oxide (IZO), metals such as gold, silver, chromium, nickel, titanium, tungsten, and aluminum, conductive compounds (for example, titanium nitride (TiN)) such as oxides or nitrides of these metals, mixtures or laminates of these metals and conductive metal oxides, and organic conductive materials such as polyaniline, polythiophene, and polypyrrole.

The method for forming electrodes is not particularly limited, and can be appropriately selected in accordance with the electrode material. Specific examples thereof include a wet method such as a coating method and a printing method, physical methods such as a vacuum vapor deposition method, a sputtering method, and an ion plating method, and chemical methods such as a CVD method and a plasma CVD method.

In a case where the material of the electrodes is ITO, examples thereof include an electron beam method, a sputtering method, a resistance thermal vapor deposition method, a chemical reaction method (such as a sol-gel method), and a coating method with a dispersion of indium tin oxide.

[Charge Blocking Film: Electron Blocking Film, Hole Blocking Film]

The photoelectric conversion element of the present invention may have a charge blocking film. In the case where the photoelectric conversion element of the present invention has this film, the characteristics (such as photoelectric conversion efficiency and response speed) of photoelectric conversion element to be obtained become superior. Examples of the charge blocking film include an electron blocking film and a hole blocking film. Hereinafter, the films will be described in detail.

(Electron Blocking Film)

The electron blocking film includes an electron donating compound. Specific examples of a low molecular material include aromatic diamine compounds such as N,N'-bis(3-methylphenyl)-(1,1'-biphenyl)-4,4'-diamine (TPD) and 4,4'-bis[N-(naphthyl)-N-phenylamino]biphenyl (α-NPD), porphyrin compounds such as porphyrin, copper tetraphenylporphyrin, phthalocyanine, copper phthalocyanine, and titanium phthalocyanine oxide, oxazole, oxadiazole, triazole, imidazole, imidazolone, a stilbene derivative, a pyrazoline derivative, tetrahydroimidazole, polyarylalkane, butadiene, 4,4',4"-tris(N-(3-methylphenyl)-N-phenylamino) triphenylamine (m-MTDATA), a triazole derivative, an oxadiazole derivative, an imidazole derivative, a polyarylalkane derivative, a pyrazoline derivative, a pyrazolone derivative, a phenylenediamine derivative, an arylamine derivative, an amino-substituted chalcone derivative, an oxazole derivative, a styrylanthracene derivative, a fluorenone derivative, a hydrazone derivative, and a silazane derivative, and specific examples of a polymer material include a polymer of phenylenevinylene, fluorene, carbazole, indole, pyrene, pyrrole, picoline, thiophene, acetylene, and diacetylene, or a derivative thereof.

The electron blocking film may be formed of a plurality of films.

The electron blocking film may be formed of an inorganic material. In general, an inorganic material has a dielectric constant larger than that of an organic material. Therefore, in a case where the inorganic material is used in the electron blocking film, a large voltage is applied to the photoelectric conversion film, and therefore, the photoelectric conversion efficiency increases. Examples of the inorganic material that can be used in the electron blocking film include calcium oxide, chromium oxide, copper chromium oxide, manganese oxide, cobalt oxide, nickel oxide, copper oxide, copper gallium oxide, copper strontium oxide, niobium oxide, molybdenum oxide, copper indium oxide, silver indium oxide, and iridium oxide.

(Hole Blocking Film)

The hole blocking film includes an electron accepting compound.

Examples of the electron accepting compound include an oxadiazole derivative such as 1,3-bis(4-tert-butylphenyl-1, 3,4-oxadiazolyl)phenylene (OXD-7), an anthraquinodimethane derivative, a diphenylquinone derivative, bathocuproine, bathophenanthroline, and derivatives thereof, a triazole compound, a tris(8-hydroxyquinolinato)aluminum complex, a bis(4-methyl-8-quinolinato)aluminum complex, a distyrylarylene derivative, a triazine compound, a phenazine compound, and a silole compound. In addition, examples thereof include compounds disclosed in paragraphs 0056 to 0057 of JP2006-100767A.

A method for manufacturing the charge blocking film is not particularly limited, and examples thereof include a dry film formation method or a wet film formation method. Examples of the dry film formation method include a vapor deposition method and a sputtering method. Any one of the physical vapor deposition (PVD) or chemical vapor deposition (CVD) may be used for the vapor deposition, but physical vapor deposition such as vacuum vapor deposition is preferable. Examples of the wet film formation method include an inkjet method, a spray method, a nozzle printing method, a spin coating method, a dip coating method, a casting method, a die coating method, a roll coating method, a bar coating method, and a gravure coating method, and an inkjet method is preferable from the viewpoint of high precision patterning.

The thickness of the charge blocking film (the electron blocking film and the hole blocking film) is preferably 10 to 200 nm, more preferably 30 to 150 nm, and still more preferably 30 to 100 nm.

[Substrate]

The photoelectric conversion element may further include a substrate. The type of substrate to be used is not particularly limited, and examples thereof include a semiconductor substrate, a glass substrate, and a plastic substrate.

The position of the substrate is not particularly limited, but in general, a conductive film, a photoelectric conversion film, and a transparent conductive film are laminated on the substrate in this order.

[Sealing Layer]

The photoelectric conversion element may further include a sealing layer. The performance of the photoelectric conversion material may deteriorate noticeably due to the presence of deterioration factors such as water molecules. The deterioration can be prevented by sealing and coating the entirety of the photoelectric conversion film with a sealing layer such as diamond-like carbon (DLC) or ceramics such as metal oxide, metal nitride, and metal nitride oxide which are dense and into which water molecules do not penneate.

Selection of the material of the sealing layer and manufacture of the sealing layer may be performed in accordance with the disclosure in paragraphs <0210> to <0215> in JP2011-082508A.

[Optical Sensor]

Examples of the application of the photoelectric conversion element include a photoelectric cell and an optical sensor, but the photoelectric conversion element of the present invention is preferably used as an optical sensor. The above-described photoelectric conversion element alone may be used in an optical sensor. Alternately, the above-described photoelectric conversion element may be used in a line sensor in which photoelectric conversion elements described above are linearly arranged or a two-dimensional sensor in which the photoelectric conversion elements are arranged on a plane. In the line sensor, the photoelectric conversion element of the present invention functions as an imaging element by converting optical image information into an electric signal using a driving unit and an optical system such as a scanner. In the two-dimensional sensor, the photoelectric conversion element of the present invention functions as an imaging element by converting optical image information into an electric signal by imaging the optical image information on the sensor in an optical system such as an imaging module.

[Imaging Element]

Next, a configuration example of an imaging element including the photoelectric conversion element 10a will be described.

In the configuration example which will be described below, the same reference numerals or the corresponding reference numerals are attached to members or the like having the same configuration or action as those which have already been described, to simplify or not to repeat the description.

The imaging element is an element that converts optical information of an image into an electric signal, and is an element in which a plurality of photoelectric conversion elements are arranged on a matrix in the same plane, optical signals are converted into electric signals in each photoelectric conversion element (pixel), and it is possible to sequentially output the electric signals to the outside of the imaging elements for each pixel. For this reason, one pixel is formed of one photoelectric conversion element and one or more transistors.

Figure 3:
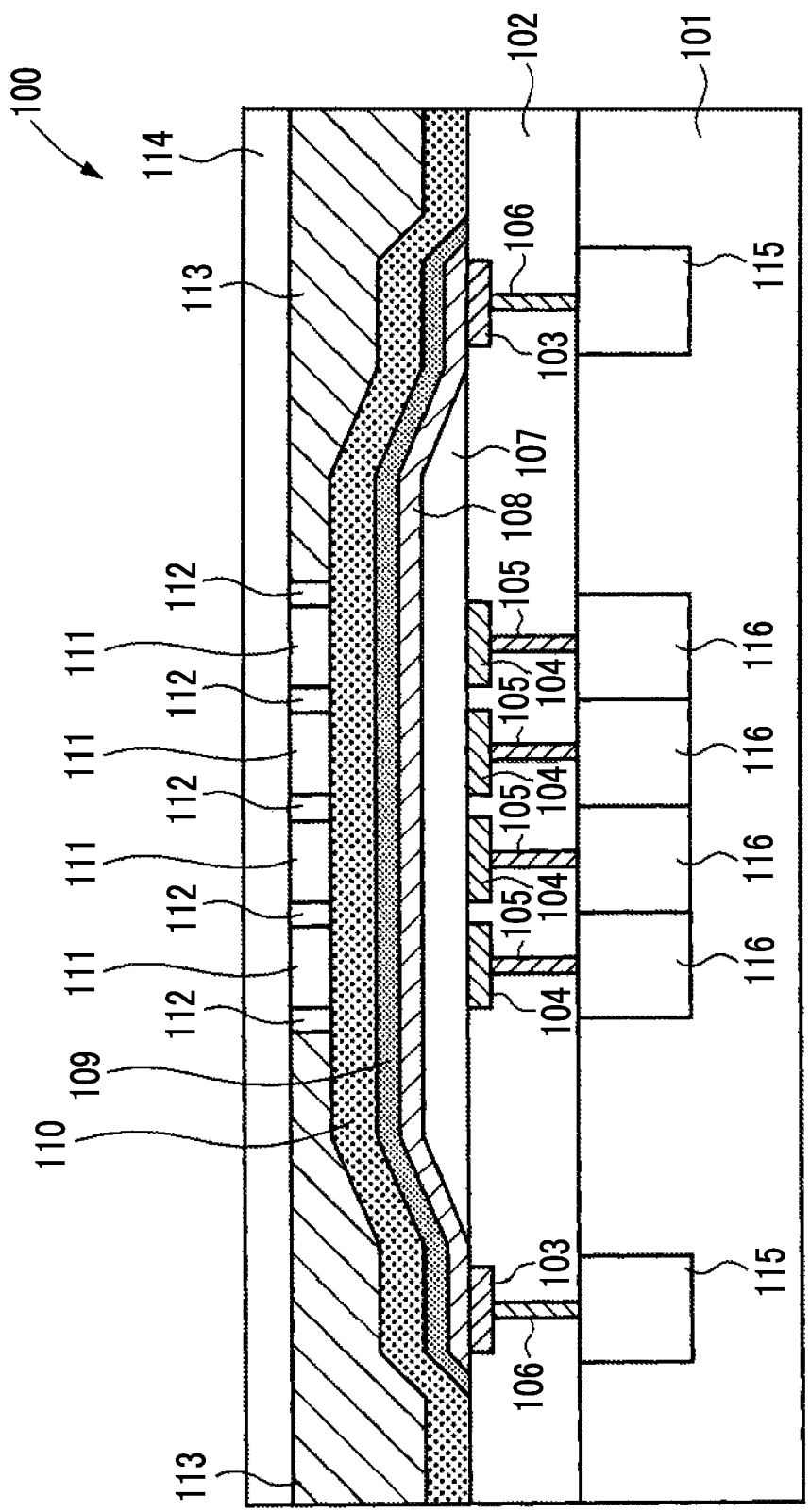
FIG. 3 is a schematic cross-sectional view of one pixel of an imaging element.

FIG. 3 is a schematic cross-sectional view showing a schematic configuration of an imaging element for describing an embodiment of the present invention. This imaging element is mounted on an imaging device such as a digital camera and a digital video camera, and imaging modules such as an electronic endoscope and a cellular phone.

The imaging element has a plurality of photoelectric conversion elements having configurations shown in FIG. 1A and a circuit substrate in which a readout circuit reading out a signal corresponding to charges generated in a photoelectric conversion film of each photoelectric conversion element is formed. The imaging element has a configuration in which the plurality of photoelectric conversion elements are one-dimensionally or two-dimensionally arranged on the same surface above the circuit substrate.

An imaging element 100 shown in FIG. 3 includes a substrate 101, an insulating layer 102, connection electrodes 103, pixel electrodes (lower electrodes) 104, connection units 105, connection units 106, a photoelectric conversion film 107, a counter electrode (upper electrode) 108, a buffer layer 109, a sealing layer 110, a color filter (CF) 111, partition walls 112, a light shielding layer 113, a protective layer 114, a counter electrode voltage supply unit 115, and readout circuits 116.

The pixel electrodes 104 have the same function as that of the lower electrode 11 of the photoelectric conversion element 10a shown in FIG. 1A. The counter electrode 108 has the same function as that of the upper electrode 15 of the photoelectric conversion element 10a shown in FIG. 1A. The photoelectric conversion film 107 has the same configuration as that of the layer provided between the lower electrode 11 and the upper electrode 15 of the photoelectric conversion element 10a shown in FIG. 1A.

The substrate 101 is a glass substrate or a semiconductor substrate of Si or the like. The insulating layer 102 is formed on the substrate 101. A plurality of pixel electrodes 104 and a plurality of connection electrodes 103 are formed on the surface of the insulating layer 102.

The photoelectric conversion film 107 is a layer common to all the photoelectric conversion elements provided so as to cover the plurality of pixel electrodes 104.

The counter electrode 108 is an electrode common to all the photoelectric conversion elements provided on the photoelectric conversion film 107. The counter electrode 108 is formed on the connection electrodes 103 arranged on an outer side than the photoelectric conversion film 107, and is electrically connected to the connection electrodes 103.

The connection units 106 are buried in the insulating layer 102, and are plugs for electrically connecting the connection electrodes 103 to the counter electrode voltage supply unit 115. The counter electrode voltage supply unit 115 is formed in the substrate 101 and applies a predetermined voltage to the counter electrode 108 via the connection units 106 and the connection electrodes 103. In a case where a voltage to be applied to the counter electrode 108 is higher than a power supply voltage of the imaging element, the power supply voltage is boosted by a boosting circuit such as a charge pump to supply the predetermined voltage.

The readout circuits 116 are provided on the substrate 101 corresponding to each of the plurality of pixel electrodes 104, and reads out a signal corresponding to charges trapped by the corresponding pixel electrodes 104. The readout circuits 116 are constituted, for example, of CCD and CMOS circuits or a thin film transistor (TFT) circuit, and are shielded by a light shielding layer not shown in the drawing which is disposed in the insulating layer 102. The readout circuits 116 are electrically connected to the corresponding the pixel electrodes 104 via the connection units 105.

The buffer layer 109 is formed on the counter electrode 108 so as to cover the counter electrode 108. The sealing layer 110 is formed on the buffer layer 109 so as to cover the buffer layer 109. Color filters 111 are formed on the sealing layer 110 at positions facing each of the pixel electrodes 104. The partition walls 112 are provided between the color filters 111 and are used for improving the light transmission efficiency of the color filters 111.

The light shielding layer 113 is formed on the sealing layer 110 in a region other than the region where the color filters 111 and the partition walls 112 are provided, and prevent light from entering the photoelectric conversion film 107 formed outside an effective pixel region. The protective layer 114 is formed on the color filters 111, the partition walls 112, and the light shielding layer 113, and protects the entirety of the imaging element 100.

In the imaging element 100 configured as described above, light which has entered is incident on the photoelectric conversion film 107, and charges are generated here. Holes among the generated charges are trapped by the pixel electrodes 104, and voltage signals corresponding to the amount are output to the outside of the imaging element 100 using the readout circuits 116.

A method for manufacturing the imaging element 100 is as follows.

The connection units 105 and 106, the plurality of connection electrodes 103, the plurality of pixel electrodes 104, and the insulating layer 102 are formed on the circuit substrate in which the counter electrode voltage supply unit 115 and the readout circuits 116 are formed. The plurality of pixel electrodes 104 are disposed, for example, in a square lattice shape on the surface of the insulating layer 102.

Next, the photoelectric conversion film 107 is formed on the plurality of pixel electrodes 104, for example, through a vacuum vapor deposition method. Next, the counter electrode 108 is formed on the photoelectric conversion film 107 under vacuum, for example, through a sputtering method. Next, the buffer layer 109 and the sealing layer 110 are sequentially formed on the counter electrode 108, through the vacuum vapor deposition method. Next, after forming the color filters 111, the partition walls 112, and the light shielding layer 113, the protective layer 114 is formed, and the imaging element 100 is completed.

EXAMPLES

Hereinafter, the present invention will be more specifically described based on the following examples. The material, the usage, the proportion, treatment contents, a treatment procedure, and the like shown in the examples below can be appropriately changed without departing from the gist of the present invention. Accordingly, the scope of the present invention should not be interpreted restrictively by the example shown below.

(Synthesis of Compound (D-1))

A compound (D-1) was synthesized according to the following scheme.

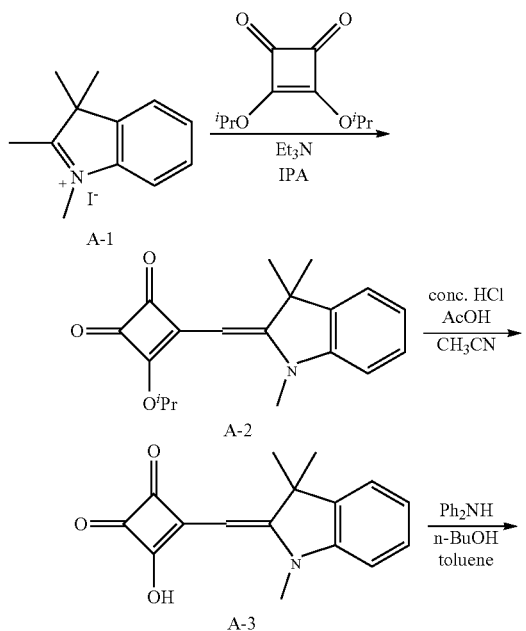

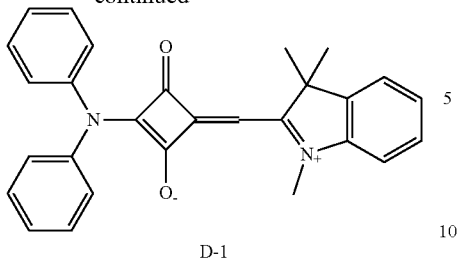

D-1

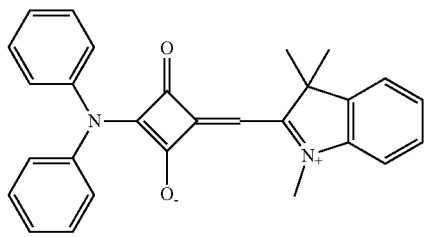
D-1

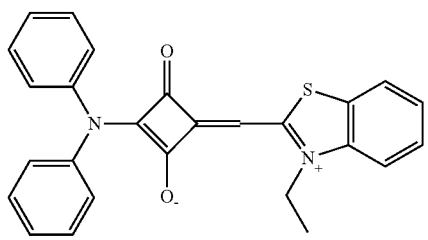
D-2

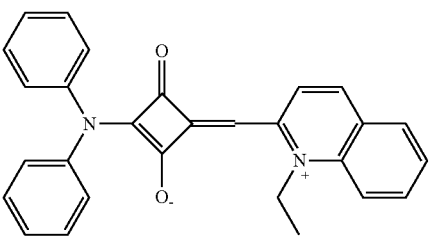
D-3

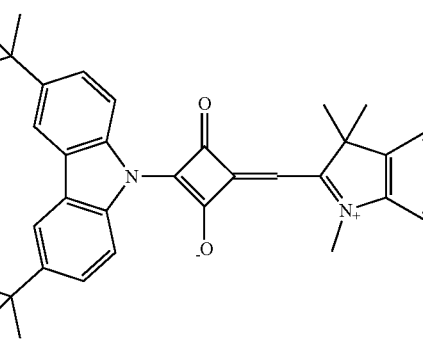
D-4

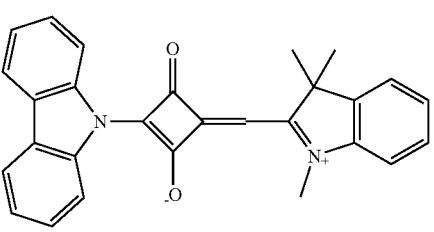
D-5

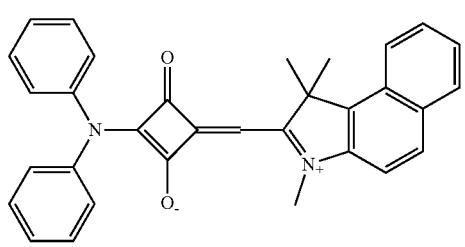
D-6

A compound (A-1) (7.60 g, 25.2 mmol) and 3,4-diisopropoxy-3-cyclobutene-1,2-dione (10.0 g, 50.4 mmol) were added to a mixed solution of triethylamine (28 mL) and isopropyl alcohol (100 mL), and the solution was heated to 80° C. and allowed to react for 9 hours. The solution was allowed to cool and then concentrated. The obtained crude body was purified with a silica gel column (30% ethyl acetate/hexane) to obtain a compound (A-2) (7.02 g, yield of 93%).

A compound (A-2) (6.70 g, 22.4 mmol) was added to a mixed solution of acetic acid (33 mL) and acetonitrile (33 mL), and concentrated hydrochloric acid (11 mL) was added dropwise thereto. After allowing the solution to react at room temperature for 7 hours, water and ethyl acetate were added to the obtained reaction solution to perform liquid separation treatment, and the organic layer was separated. After adding magnesium sulfate to the separated organic layer, filtration treatment was performed, and the obtained filtrate was concentrated to obtain a compound (A-3) (4.86 g, yield of 80%).

A compound (A-3) (1.00 g, 3.7 mmol) and diphenylamine (0.75 g, 3.7 mmol) were added to a mixed solution of 1-butanol (20 mL) and toluene (20 mL), the solution was heated to 120° C. and allowed to react for 4 hours. The solution was allowed to cool to room temperature and then concentrated. The obtained crude body was purified with a silica gel column (50% ethyl acetate/chloroform) to obtain a compound (D-1) (0.94 g, yield of 60%). The obtained compound (D-1) was identified through nuclear magnetic resonance (NMR) and mass spectrometry (MS).

Figure 4:
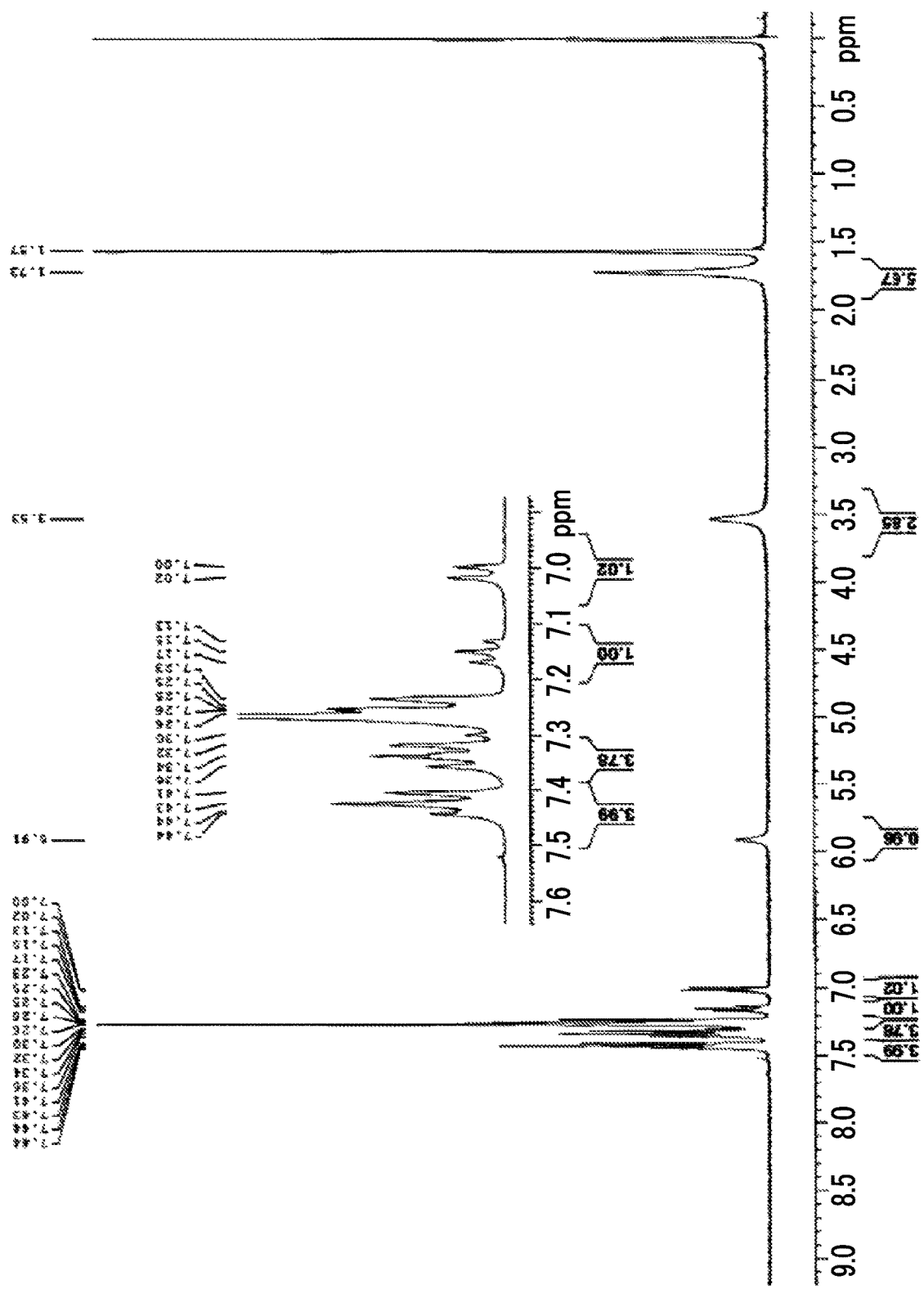
FIG. 4 is a H Nuclear Magnetic Resonance (NMR) spectrum of a compound (D-1).

A $^1$H NMR spectrum (400 MHz, CDCl$_3$) is shown in FIG. 4.

MS(ESI$^+$) m/z: 420.3 ([M+H]$^+$)

Figure 5:
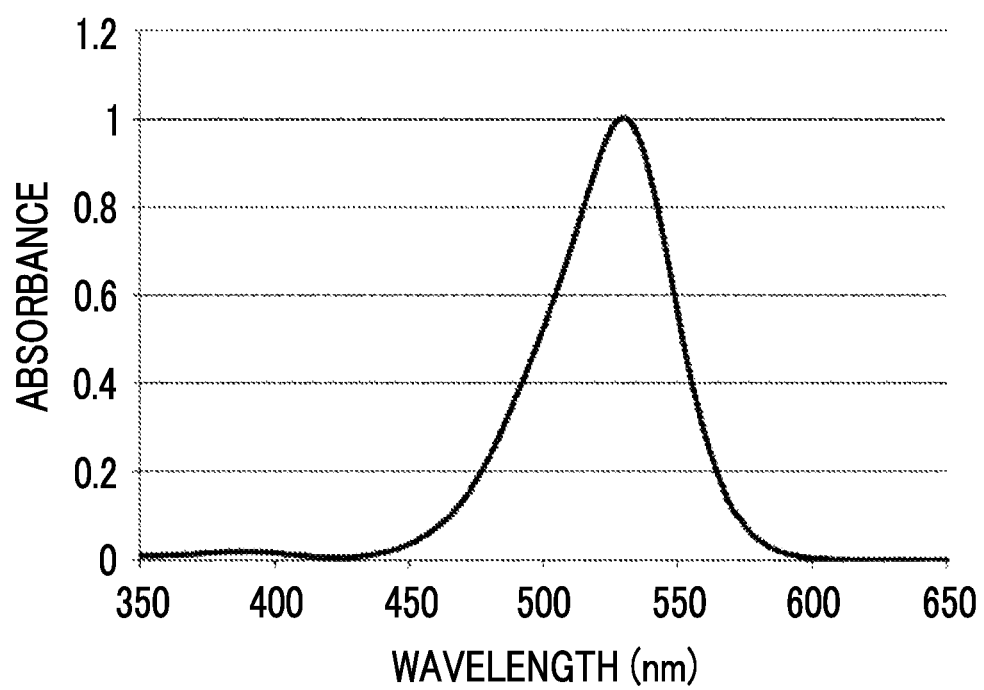
FIG. 5 is an absorption spectrum of the compound (D-1) in a chloroform solution.

In addition, FIG. 5 shows an absorption spectrum of the compound (D-1) in a chloroform solution. The absorption spectrum was measured at a concentration of 10 μM (concentration at which the absorbance was about 0.5 to 1) using UV-3600 manufactured by Shimadzu Corporation.

The ionization potential of the compound (D-1) was −5.13 eV.

Hereinafter, synthesis of compounds (D-2) to (D-13) was performed using the same reaction.

A compound (R-1) corresponding to a comparative compound was purchased from Luminescence Technology. In addition, a compound (R-2) corresponding to a comparative compound corresponds to the squarylium compound disclosed in JP1991-188683A (JP-H03-188683A).

-continued

D-7
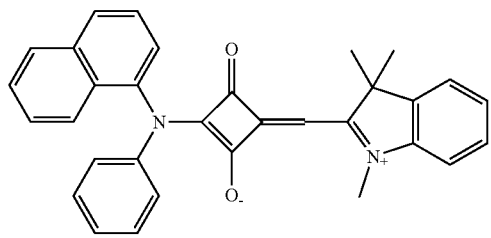

D-8
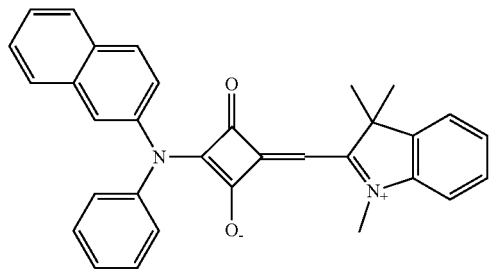

D-9
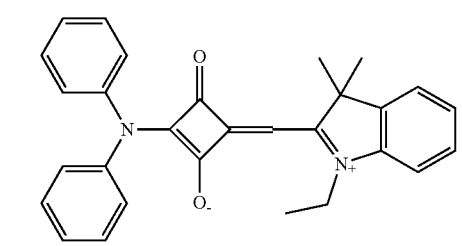

D-10
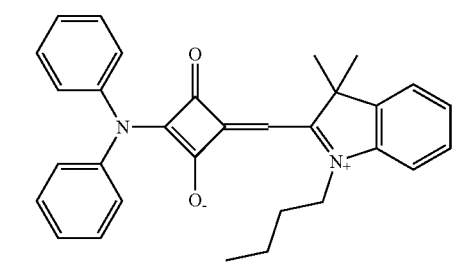

D-11
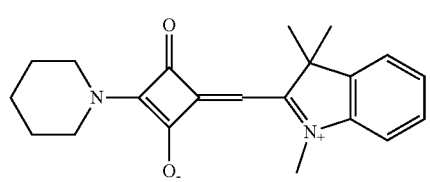

D-12
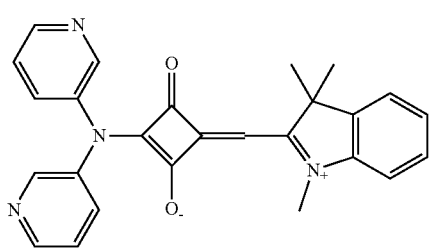

-continued

D-13
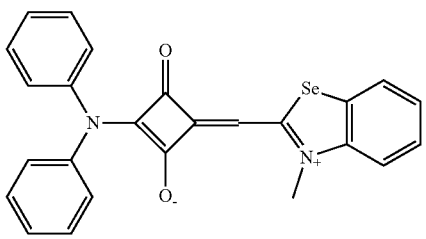

R-1
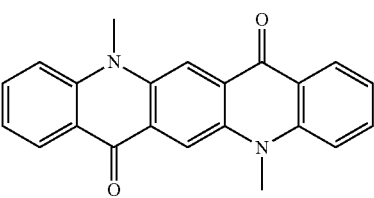

R-2
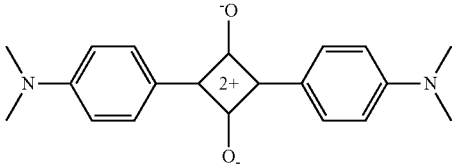

<Manufacture of Photoelectric Conversion Element>

A photoelectric conversion element in a form of FIG. 1A was produced using the obtained compounds. Hereinafter, a case where the compound (D-1) is used will be described in detail.

Specifically, an amorphous ITO film was formed on a glass substrate through a sputtering method to form the lower electrode 11 (thickness: 30 nm), a molybdenum oxide ($MoO_X$) film was further formed on the lower electrode 11 through a vacuum thermal vapor deposition method to form a molybdenum oxide layer (thickness: 30 nm) as the electron blocking film 16A.

Furthermore, the compound (D-1) and the following compound (N-1) were subjected to co-vapor deposition through vacuum thermal vapor deposition so as to be respectively at 40 nm in terms of a single layer so as to form a film on a molybdenum oxide layer in a state where the temperature of the substrate was controlled to be 25° C., and the photoelectric conversion film 12 at 80 nm was formed.

Furthermore, an amorphous ITO film was formed on the photoelectric conversion film 12 through a sputtering method to form the upper electrode 15 (transparent conductive film) (thickness: 10 nm). After forming a SiO film on the upper electrode 15 as a sealing layer through thermal vapor deposition, an aluminum oxide ($Al_2O_3$) layer was formed thereon through atomic layer chemical vapor deposition (ALCVD) method to produce a photoelectric conversion element.

A photoelectric conversion element produced here, that is, a photoelectric conversion element comprising the photoelectric conversion film 12 having the compound (D-1) and the following compound (N-1) respectively at 40 nm in terms of a single layer is called a photoelectric conversion element A.

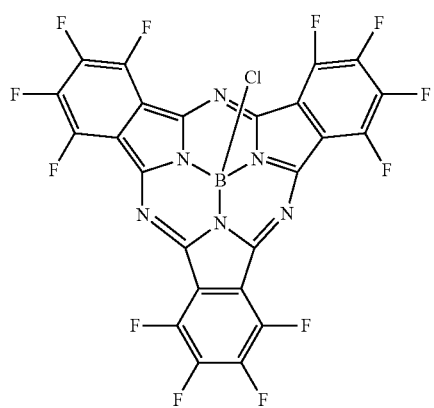

N-1

A photoelectric conversion element A of each example was produced according to the same procedure as above except that the above-described compound (D-1) was changed to compounds (D-2) to (D-13) and compounds (R-1) and (R-2).

<Evaluation>
(Operation Confirmation as Photoelectric Conversion Element)

The following evaluation of operation confirmation was performed using each obtained photoelectric conversion element A.

Specifically, a voltage was applied to the photoelectric conversion elements A so as to have an intensity of $2.0 \times 10^5$ V/cm, and the external quantum efficiency (which is an efficiency obtained by converting incident photons to output electrons and is also called the following "photoelectric conversion efficiency") of the photoelectric conversion at 550 nm was measured.

As a result, it was confirmed that the obtained photoelectric conversion elements A had a photoelectric conversion efficiency of more than 30% at 550 nm and function as photoelectric conversion elements.

(Evaluation of Responsiveness)

The following evaluation of responsiveness was performed using each obtained photoelectric conversion element A.

Specifically, a voltage was applied to each photoelectric conversion element A so that the intensity became $2.0 \times 10^5$ V/cm. Thereafter, light emitting diode (LED) was instantaneously turned on to radiate light from the upper electrode (transparent conductive film) side. The photocurrent at that time was measured with an oscilloscope to obtain a rise time between signal intensities of 0% to 97%. Then, the relative value when the rise time in Comparative Example 1 was set to 10 was obtained.

A relative value of the rise time with respect to Comparative Example 1 being is less than 3 was set as "A", a relative value thereof being greater than or equal to 3 and less than 5 was set as "B", a relative value thereof being greater than or equal to 5 and less than 10 was set as "C", and a relative value thereof being greater than or equal to 10 was set as "D". The results are shown in Table 4. For practical use, "A" or "B" is preferable, and "A" is more preferable.

(Evaluation of Manufacturing Suitability (Compositional Ratio Dependency of Photoelectric Conversion Efficiency))

Photoelectric conversion elements B were produced through the same method as in the production of the above-described photoelectric conversion elements A except that the compound (D-1) and the compound (N-1) of the photoelectric conversion film 12 are respectively at 30 nm and 50 nm in terms of a single layer. In addition, photoelectric conversion elements C were produced through the same method as in the production of the above-described photoelectric conversion elements A except that the compound (D-1) and the compound (N-1) of the photoelectric conversion film 12 are respectively at 50 nm and 30 nm in terms of a single layer.

In other words, three kinds of photoelectric conversion elements (A, B, C) having different compositional ratios between the compound (D-1) and the n-type organic semiconductor (in other words, having different contents of the compound (D-1) in the photoelectric conversion film 12) in the photoelectric conversion film 12 were prepared.

The following evaluation of the photoelectric conversion efficiency was performed using the photoelectric conversion elements A to C.

Specifically, a photoelectric conversion efficiency at 550 nm was measured by applying a voltage to each photoelectric conversion element so as to have an intensity of $2.0 \times 10^5$ V/cm, and a comparative evaluation was performed based on relative values thereof.

In a case where the average value of the photoelectric conversion efficiency of the photoelectric conversion elements A to C is set to 1 and a value of the photoelectric conversion efficiency of the photoelectric conversion elements having the largest relative value is 0.9 to 1.1, it was evaluated as "A". In a case where the value of the photoelectric conversion efficiency thereof is greater than or equal to 0.8 and less than 0.9, or greater than 1.1 and less than or equal to 1.2, it was evaluated as "B". In a case where the value of the photoelectric conversion efficiency thereof is less than 0.8 or greater than 1.2, it was evaluated as "C". For practical use, "A" or "B" is preferable, and "A" is more preferable.

Photoelectric conversion elements B and C of each example were produced according to the same procedure as above except that the above-described compound (D-1) was changed to compounds (D-2) to (D-13) and compounds (R-1) and (R-2), and the same evaluation as above was performed.

The results are shown in Table 4.

TABLE 4

| | Compound | | Evaluation | | |
|---|---|---|---|---|---|
| Example | Kind | Maximum absorption wavelength (nm) | Responsiveness | Manufacturing suitability (compositional ratio dependency of photoelectric conversion efficiency) | Remarks |
| 1 | D-1 | 530 | A | A | Present invention |
| 2 | D-2 | 542 | A | A | Present invention |
| 3 | D-3 | 598 | A | A | Present invention |

TABLE 4-continued

| Example | Compound | | Evaluation | | Remarks |
|---|---|---|---|---|---|
| | Kind | Maximum absorption wavelength (nm) | Responsiveness | Manufacturing suitability (compositional ratio dependency of photoelectric conversion efficiency) | |
| 4 | D-4 | 576 | A | B | Present invention |
| 5 | D-5 | 568 | A | B | Present invention |
| 6 | D-6 | 550 | B | A | Present invention |
| 7 | D-7 | 528 | A | A | Present invention |
| 8 | D-8 | 540 | A | A | Present invention |
| 9 | D-9 | 531 | A | A | Present invention |
| 10 | D-10 | 531 | B | A | Present invention |
| 11 | D-11 | 480 | B | B | Present invention |
| 12 | D-12 | 532 | B | A | Present invention |
| 13 | D-13 | 550 | A | A | Present invention |
| 14 | R-1 | 520 | D | C | Comparative Example |
| 15 | R-2 | 628 | C | C | Comparative Example |

From the results in Table 4, it was confirmed that the photoelectric conversion elements of the present invention containing the compound represented by Formula (1) as a photoelectric conversion material exhibited excellent responsiveness and manufacturing suitability (characteristics of low compositional ratio dependency of the photoelectric conversion efficiency).

It was shown from the contrast between Examples 1, 4, 5, 7, 8, 11, and 12 that, in a case where $R^1$ and $R^2$ in the compound represented by Formula (1) are aryl groups or heteroaryl groups (in other words, in a case where the photoelectric conversion material is the compound represented by Formula (2)), it is possible to achieve both the responsiveness and the manufacturing suitability (characteristics of low compositional ratio dependency of the photoelectric conversion efficiency) with better balance.

In particular, it was confirmed from the contrast between Examples 1, 4, 5, 7, 8, and 12 that, in a case where $R^1$ and $R^2$ in the compound represented by Formula (1) are aryl groups, the responsiveness became superior. In particular, it was confirmed from the contrast between Examples 1, 4, 5, 7, and 8 that, in a case where $R^1$ and $R^2$ are aryl groups and are not linked to each other to form a ring, it is possible to achieve both the responsiveness and the manufacturing suitability (characteristics of low compositional ratio dependency of the photoelectric conversion efficiency) at a superior level.

It was confirmed from the contrast between Examples 1 and 6 that, in a case where $R^4$ to $R^7$ in the compound represented by Formula (2) are hydrogen atoms, the responsiveness became superior.

It was confirmed from the contrast between Examples 1, 9, and 10 that, in a case where $R^3$ in the compound represented by Formula (2) is an alkyl group having 1 to 3 carbon atoms, the responsiveness became superior.

In the photoelectric conversion elements of Comparative Examples 1 and 2, both the responsiveness and the manufacturing suitability (characteristics of low compositional ratio dependency of the photoelectric conversion efficiency) did not satisfy the desired requirements.

<Production of Imaging Element>

The same imaging element as that shown in FIG. 3 was produced. That is, a 30 nm amorphous TiN film was formed on a CMOS substrate through a sputtering method, and was then used as a lower electrode through patterning such that each pixel was present on a photodiode (PD) on the CMOS substrate through photolithography. The imaging element was produced similarly to Examples 1 to 13 after the film formation of the electron blocking material. Evaluation of responsiveness and manufacturing suitability (compositional ratio dependency of photoelectric conversion efficiency) of each of the obtained imaging elements was also carried out in the same manner, and the same results as those in Table 4 were obtained. It was found that each of the imaging elements also exhibited excellent performance.

EXPLANATION OF REFERENCES 10a, 10b: photoelectric conversion element
11: conductive film (lower electrode)
12: photoelectric conversion film
15: transparent conductive film (upper electrode)
16A: electron blocking film
16B: hole blocking film
100: pixel separation type imaging element
101: substrate
102: insulating layer
103: connection electrode
104: pixel electrode (lower electrode)
105: connection unit
106: connection unit
107: photoelectric conversion film
108: counter electrode (upper electrode)
109: buffer layer
110: sealing layer
111: color filter (CF)
112: partition wall
113: light shielding layer
114: protective layer
115: counter electrode voltage supply unit
116: readout circuit
200: photoelectric conversion element (hybrid type photoelectric conversion element)
201: inorganic photoelectric conversion film
202: n-type well
203: p-type well
204: n-type well
205 p-type silicon substrate
207: insulating layer
208: pixel electrode
209: organic photoelectric conversion film
210: common electrode 211: protective film
212: electron blocking film

What is claimed is:

1. A photoelectric conversion element comprising:
a conductive film;
a photoelectric conversion film; and
a transparent conductive film in this order,
wherein the photoelectric conversion film contains a compound represented by Formula (1),

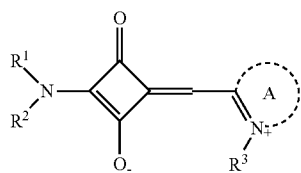

in Formula (1), $R^1$ and $R^2$ each independently represent an alkyl group, an aryl group, or a heteroaryl group, $R^1$ and $R^2$ may be linked to each other to form a ring, $R^3$ represents an alkyl group, an aryl group, or a heteroaryl group, and A represents a ring at least containing one carbon atom and one cationic nitrogen atom.

2. The photoelectric conversion element according to claim 1,
wherein a maximum absorption wavelength of the compound represented by Formula (1) is within a range of 500 to 600 nm.

3. The photoelectric conversion element according to claim 1,
wherein the compound represented by Formula (1) is a compound represented by Formula (2),

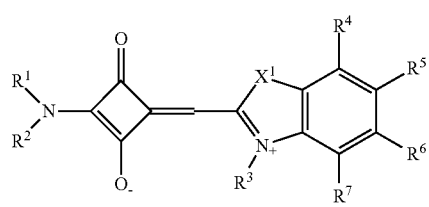

in Formula (2), $R^1$ and $R^2$ each independently represent an aryl group or a heteroaryl group, $R^1$ and $R^2$ may be linked to each other to form a ring, $R^3$ represents an alkyl group, an aryl group, or a heteroaryl group, and $R^4$ to $R^7$ each independently represent a hydrogen atom or a substituent, $R^4$ and $R^5$, $R^5$ and $R^6$, or $R^6$ and $R^7$ may be linked to each other to form a ring, $X^1$ represents any one selected from a sulfur atom, an oxygen atom, a selenium atom, $CR^{A1}R^{A2}$, $CR^{A3}{=}CR^{A4}$, or $NR^{A5}$, and $R^{A1}$ to $R^{A5}$ each independently represent a hydrogen atom, an alkyl group, an aryl group, or a heteroaryl group.

4. The photoelectric conversion element according to claim 2,
wherein the compound represented by Formula (1) is a compound represented by Formula (2),

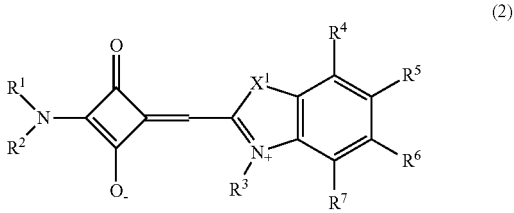

in Formula (2), $R^1$ and $R^2$ each independently represent an aryl group or a heteroaryl group, $R^1$ and $R^2$ may be linked to each other to form a ring, $R^3$ represents an alkyl group, an aryl group, or a heteroaryl group, and $R^4$ to $R^7$ each independently represent a hydrogen atom or a substituent, $R^4$ and $R^5$, $R^5$ and $R^6$, or $R^6$ and $R^7$ may be linked to each other to form a ring, $X^1$ represents any one selected from a sulfur atom, an oxygen atom, a selenium atom, $CR^{A1}R^{A2}$, $CR^{A3}{=}CR^{A4}$, or $NR^{A5}$, and $R^{A1}$ to $R^{A5}$ each independently represent a hydrogen atom, an alkyl group, an aryl group, or a heteroaryl group.

5. The photoelectric conversion element according to claim 1,
wherein $R^1$ and $R^2$ are aryl groups.

6. The photoelectric conversion element according to claim 2,
wherein $R^1$ and $R^2$ are aryl groups.

7. The photoelectric conversion element according to claim 1,
wherein $R^3$ is an alkyl group having 1 to 3 carbon atoms.

8. The photoelectric conversion element according to claim 2,
wherein $R^3$ is an alkyl group having 1 to 3 carbon atoms.

9. The photoelectric conversion element according to claim 3,
wherein $R^4$ to $R^7$ are hydrogen atoms.

10. The photoelectric conversion element according to claim 1,
wherein the photoelectric conversion film further contains an n-type organic semiconductor.

11. The photoelectric conversion element according to claim 1, further comprising:
an electric charge blocking film.

12. An optical sensor comprising:
the photoelectric conversion element according to claim 1.

13. An imaging element comprising:
the photoelectric conversion element according to claim 1.

* * * * *